(12) United States Patent
Song et al.

(10) Patent No.: US 10,773,492 B2
(45) Date of Patent: Sep. 15, 2020

(54) MULTI-STACK JOINED BODY, METHOD OF MANUFACTURING THE SAME, AND DISPLAY DEVICE INCLUDING THE SAME

(71) Applicant: Samsung Display Co., Ltd., Yongin-si (KR)

(72) Inventors: Si Joon Song, Suwon-si (KR); Eui Jeong Kang, Suwon-si (KR); Yong Hoon Kwon, Hwaseong-si (KR); Won Jin Kim, Hwaseong-si (KR); Jung Hyun Kim, Suwon-si (KR); Woo Suk Seo, Yongin-si (KR); Young Hye Son, Yongin-si (KR); Sang Woo Ha, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 50 days.

(21) Appl. No.: 16/041,453

(22) Filed: Jul. 20, 2018

(65) Prior Publication Data

US 2019/0047251 A1  Feb. 14, 2019

(30) Foreign Application Priority Data

Aug. 14, 2017 (KR) .......................... 10-2017-0102852

(51) Int. Cl.
| | | |
|---|---|---|
| *G02F 1/1339* | (2006.01) | |
| *B32B 7/12* | (2006.01) | |
| *G02F 1/13357* | (2006.01) | |
| *H01L 51/52* | (2006.01) | |
| *F21V 8/00* | (2006.01) | |
| *H01L 27/32* | (2006.01) | |

(52) U.S. Cl.
CPC .............. *B32B 7/12* (2013.01); *G02B 6/0023* (2013.01); *G02F 1/1339* (2013.01); *G02F 1/133602* (2013.01); *H01L 51/5246* (2013.01); *B32B 2307/412* (2013.01); *B32B 2457/202* (2013.01); *B32B 2457/206* (2013.01); *G02B 6/0026* (2013.01); *G02B 6/0088* (2013.01); *H01L 27/32* (2013.01)

(58) Field of Classification Search
CPC .................................................. G02B 6/0023
See application file for complete search history.

(56) References Cited

U.S. PATENT DOCUMENTS

| | | | | |
|---|---|---|---|---|
| 2005/0208361 A1* | 9/2005 | Enjoji | ................. | H01M 8/0267 429/483 |
| 2009/0294048 A1* | 12/2009 | Matsuo | ................. | B23K 26/14 156/272.8 |
| 2009/0323004 A1* | 12/2009 | Ide | ........................ | G02F 1/1339 349/143 |

(Continued)

*Primary Examiner* — Sang V Nguyen
(74) *Attorney, Agent, or Firm* — Cantor Colburn LLP

(57) ABSTRACT

A multi-stack joined body includes a first transparent member, a second transparent member disposed on the first transparent member, and an intermediate layer interposed between the first transparent member and the second transparent member, where a joining region in which a physical boundary is not provided between the first transparent member and the intermediate layer and between the second transparent member and the intermediate layer is provided across the first transparent member, the intermediate layer, and the second transparent member.

20 Claims, 15 Drawing Sheets

(56) References Cited

U.S. PATENT DOCUMENTS

| | | | |
|---|---|---|---|
| 2011/0200802 A1* | 8/2011 | Li | B29C 66/934 |
| | | | 428/198 |
| 2013/0146938 A1* | 6/2013 | Prushinskiy | H01L 51/5246 |
| | | | 257/100 |
| 2015/0027168 A1* | 1/2015 | Dabich, II | C03C 3/23 |
| | | | 65/41 |
| 2015/0355410 A1* | 12/2015 | Park | G02F 1/0147 |
| | | | 385/37 |
| 2016/0124351 A1* | 5/2016 | Wu | G03G 15/162 |
| | | | 399/308 |
| 2016/0276269 A1* | 9/2016 | Peng | H01L 23/5227 |
| 2016/0306114 A1 | 10/2016 | Kashyap et al. | |
| 2017/0064884 A1* | 3/2017 | Kim | H05K 13/041 |
| 2017/0200913 A1* | 7/2017 | Yoshida | H01L 51/5234 |
| 2017/0243672 A1* | 8/2017 | Cheng | B32B 37/06 |
| 2017/0294424 A1* | 10/2017 | Jeong | H01L 25/167 |
| 2017/0355223 A1* | 12/2017 | Shibahara | B32B 7/12 |
| 2019/0006563 A1* | 1/2019 | Sato | C09K 11/02 |

\* cited by examiner

MULTI-STACK JOINED BODY, METHOD OF MANUFACTURING THE SAME, AND DISPLAY DEVICE INCLUDING THE SAME

This application claims priority to Korean Patent Application No. 10-2017-0102852, filed on Aug. 14, 2017, and all the benefits accruing therefrom under 35 U.S.C. § 119, the content of which in its entirety is herein incorporated by reference.

BACKGROUND

1. Field

Exemplary embodiments of the invention relate to a multi-stack joined body, a method of manufacturing the multi-stack joined body, and a display device including the multi-stack joined body.

2. Description of the Related Art

Display devices are increasingly important with a development of multimedia. Accordingly, various display devices such as a liquid crystal display ("LCD") and an organic light emitting diode ("OLED") display are being developed.

Image display by the display devices such as an LCD and an OLED display are all performed by transmission of light. Particularly, transmittance of light may affect display qualities such as luminance of a display device. In this regard, components constituting a display device may at least partially include a transparent member, e.g., a glass member.

Examples of a method of forming a multi-stack joined body by coupling a plurality of transparent members may include a method of joining using a sealant, which is a liquid or creamy adhesive, and a method of joining using glass frit or glass powder.

In the method of joining using the sealant, a liquid or creamy sealant material may be applied between a first glass member and a second glass member, and the sealant material may be hardened so that the first glass member and the second glass member are joined to each other.

In the method of joining using the glass frit or glass powder, a glass frit or glass powder material may be applied between a first glass member and a second glass member, melted and hardened so that the first glass member and the second glass member are joined to each other.

SUMMARY

However, both the method of joining using a sealant and the method of joining using glass frit or glass powder are joining methods that maintain a joining interface between the first glass member and the second glass member. That is, the method of joining using a sealant and the method of joining using glass frit or glass powder are joining methods in which a deformation does not occur at a joining interface between the glass members at a joining portion. Consequently, the method of joining using a sealant and the method of joining using glass frit or glass powder have limitations in that joining strengths per unit area are about 6 megapascals (MPa) and about 10 MPa, respectively. Further, the method of joining using a sealant is vulnerable to infiltration of foreign substances such as gas and moisture because the sealant material includes an organic material.

Thus, exemplary embodiments of the invention provide a multi-stack joined body with a new structure having an excellent joining strength and low gas permeability by coupling a plurality of transparent members.

Exemplary embodiments of the invention also provide a method of manufacturing a multi-stack joined body for coupling a plurality of transparent members.

Exemplary embodiments of the invention also provide a display device with improved reliability and durability by including a multi-stack joined body with a new structure.

It should be noted that objects of the invention are not limited to the above-described objects, and other objects of the invention will be apparent to those skilled in the art from the following descriptions.

According to an exemplary embodiment of the invention, there is provided a multi-stack joined body including a first transparent member, a second transparent member disposed on the first transparent member, and an intermediate layer interposed between the first transparent member and the second transparent member, where a joining region in which a physical boundary is not provided between the first transparent member and the intermediate layer and between the second transparent member and the intermediate layer is provided across the first transparent member, the intermediate layer, and the second transparent member.

In an exemplary embodiment, a physical boundary may be provided at a part of a contact surface between the first transparent member and the intermediate layer, and a physical boundary may be provided at a part of a contact surface between the second transparent member and the intermediate layer.

In an exemplary embodiment, a refractive index of the joining region may be different from a refractive index of the first transparent member, a refractive index of the second transparent member, and a refractive index of the intermediate layer, and a density of the joining region may be different from a density of the first transparent member, a density of the second transparent member, and a density of the intermediate layer.

In an exemplary embodiment, the first transparent member and the second transparent member may be spaced apart from each other, and a distance between the first transparent member and the second transparent member may be equal to or greater than about 2 μm.

In an exemplary embodiment, the intermediate layer may include an inorganic material including silicon oxide, silicon nitride, or silicon oxynitride or a metal material.

In an exemplary embodiment, the intermediate layer may further include at least one inorganic crystalline materials of a phosphate, an arsenate, a borate, germanium sulfide, indium selenide, and cadmium selenide.

In an exemplary embodiment, the first transparent member or the second transparent member may include about 60.0 weight percent (weight %) to about 85.0 weight % of silicon oxide, about 2.0 weight % to about 20.0 weight % of aluminum oxide, and about 0.1 weight % to about 15.0 weight % of boron oxide.

In an exemplary embodiment, a seed-shaped structure having a long axis and a short axis may be provided within the joining region, and the seed-shaped structure may be disposed across the first transparent member and the intermediate layer.

In an exemplary embodiment, the seed-shaped structure may be also disposed across the second transparent member.

In an exemplary embodiment, a length of the seed-shaped structure in a long-axis direction may be about 50 micrometers (μm) to about 150 μm, a length of the seed-shaped structure in a short-axis direction may be about 1/20 to about 1/5 of the length of the seed-shaped structure in the long-axis direction, a length of the joining region in the long-axis direction may be about 1 time to about 4 times the length of the seed-shaped structure in the long-axis direction, and a length of the joining region in the short-axis direction may be about 5 times to about 15 times the length of the seed-shaped structure in the short-axis direction.

In an exemplary embodiment, the joining region may include a first joining region and a second joining region that are spaced apart from each other, a physical boundary may be provided at a part of a contact surface between the first transparent member and the intermediate layer, which between the first joining region and the second joining region, and a physical boundary may be provided at a part of a contact surface between the second transparent member and the intermediate layer, which between the first joining region and the second joining region.

In an exemplary embodiment, the intermediate layer may include a first intermediate layer contacting the first transparent member and a second intermediate layer partially having a physical boundary with the first intermediate layer and contacting the second transparent member, the first transparent member, the first intermediate layer, the second intermediate layer, and the second transparent member may be partially jointed to each other and unitary, and the joining region may be disposed across the first transparent member, the first intermediate layer, the second intermediate layer, and the second transparent member.

According to an exemplary embodiment of the invention, there is provided a method of manufacturing a multi-stack joined body. The method includes preparing a stacked body including a first transparent member, a second transparent member disposed on the first transparent member, and an intermediate layer interposed between the first transparent member and the second transparent member, and forming a joining region in which a physical boundary is not provided between the first transparent member and the intermediate layer and between the second transparent member and the intermediate layer by irradiating the stacked body with a laser, where the joining region is disposed across the first transparent member, the intermediate layer, and the second transparent member.

In an exemplary embodiment, the forming the joining region by irradiating the laser may include forming a focus of the laser in the first transparent member, and forming the joining region by irradiating the focus with the laser having a pulse width of about 10 fs (femtoseconds) to about 50 fs so that the laser sequentially passes through the second transparent member and the intermediate layer, where a seed-shaped structure may be provided within the joining region, and the seed-shaped structure may be provided to grow toward the second transparent member from a position of the focus.

In an exemplary embodiment, the preparing the stacked body may include preparing the first transparent member, directly forming the intermediate layer on the first transparent member using a physical vapor deposition method, and disposing the second transparent member on the intermediate layer, where the intermediate layer may include a metal material including silver, gold, platinum, copper, aluminum, molybdenum, titanium, an alloy thereof, a metal oxide thereof, a metal nitride thereof.

In an exemplary embodiment, the preparing the stacked body may include preparing the first transparent member, directly forming the intermediate layer on the first transparent member using a chemical vapor deposition method, and disposing the second transparent member on the intermediate layer, where the intermediate layer may include an inorganic material including silicon oxide, silicon nitride, and silicon oxynitride.

According to an exemplary embodiment of the invention, there is provided a display device. The display device includes a multi-stack joined body including a first transparent member, a second transparent member disposed on the first transparent member, and an intermediate layer interposed between the first transparent member and the second transparent member, where a joining region in which a physical boundary is not provided between the first transparent member and the intermediate layer, and between the second transparent member and the intermediate layer is disposed across the first transparent member, the intermediate layer, and the second transparent member.

In an exemplary embodiment, the display device may be an organic light emitting display device, and the organic light emitting display device may include the first transparent member, an organic light emitting element disposed on the first transparent member, the second transparent member disposed on the organic light emitting element, and the intermediate layer interposed between the first transparent member and the second transparent member and disposed to at least partially surround the organic light emitting element.

In an exemplary embodiment, the display device may be a liquid crystal display device, the liquid crystal display device may include a backlight unit, and a liquid crystal display panel disposed on the backlight unit, the backlight unit may include a light source which emits light in a blue wavelength band, a light guide plate which receives light from the light source, guide the light, and then projects the light toward the liquid crystal display panel, and a wavelength converter disposed on an optical path from the light source to the light guide plate and which converts a wavelength of incident light and projects the light, and the wavelength converter may include a wavelength converting material, the first transparent member which defines a space in which the wavelength converting material is accommodated, the second transparent member disposed on the first transparent member to seal the wavelength converting material, and the intermediate layer interposed between the first transparent member and the second transparent member and partially joined to the first transparent member and the second transparent member to be unitary therewith.

In an exemplary embodiment, the display device may be a liquid crystal display device, the liquid crystal display device may include a backlight unit, and a liquid crystal display panel disposed on the backlight unit, the backlight unit may include a light source which emits light in a blue wavelength band, the first transparent member which receives light from the light source, guides the light, and then projects the light toward the liquid crystal display panel, and a wavelength converter disposed on an optical path from the light source to the first transparent member and which converts a wavelength of incident light and projects the light, and the wavelength converter may include a wavelength converting material, the second transparent member which defines a space in which the wavelength converting material is accommodated, and the intermediate layer interposed between the first transparent member and the second transparent member and partially joined to the first transparent member and the second transparent member to be unitary therewith.

BRIEF DESCRIPTION OF THE DRAWINGS

The above and other exemplary embodiments and features of the invention will become more apparent by describing exemplary embodiments thereof in detail with reference to the attached drawings, in which.

DETAILED DESCRIPTION

Figure 1:
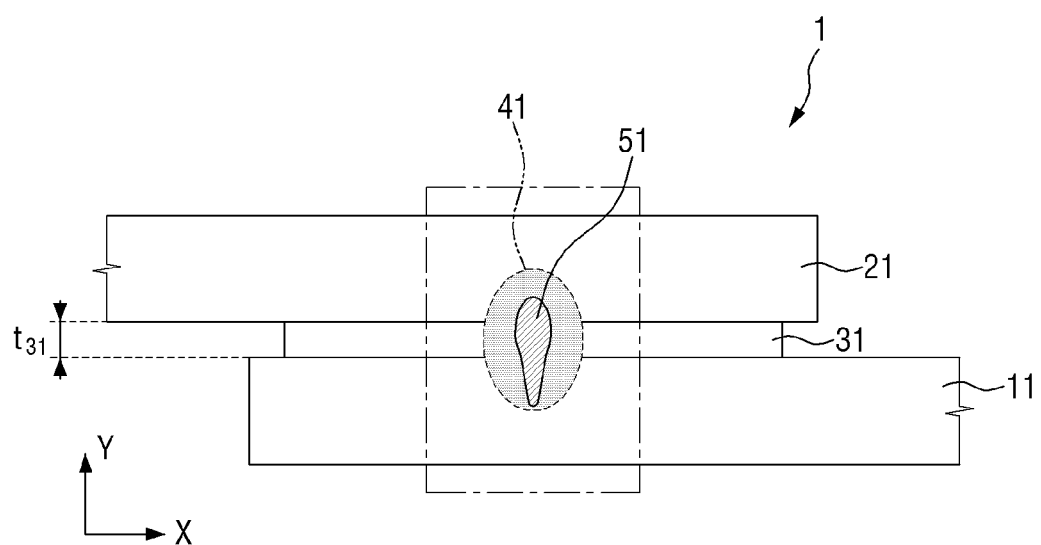
FIG. 1 is a cross-sectional view of an exemplary embodiment of a multi-stack joined body according to the invention.

Features of the invention and methods of accomplishing the same may be understood more readily by reference to the following detailed description of preferred embodiments and the accompanying drawings. The invention may, however, be embodied in many different forms and should not be construed as being limited to the exemplary embodiments set forth herein. Rather, these embodiments are provided so that this disclosure will be thorough and complete and will fully convey the concept of the invention to those skilled in the art, and the invention will only be defined by the appended claims.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the drawing figures. It will be understood that the spatially relative terms are intended to encompass different orientations of the device in use or operation, in addition to the orientation depicted in the drawing figures. For example, if the device in the drawing figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof "At least one" is not to be construed as limiting "a" or "an." "Or" means "and/or." As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
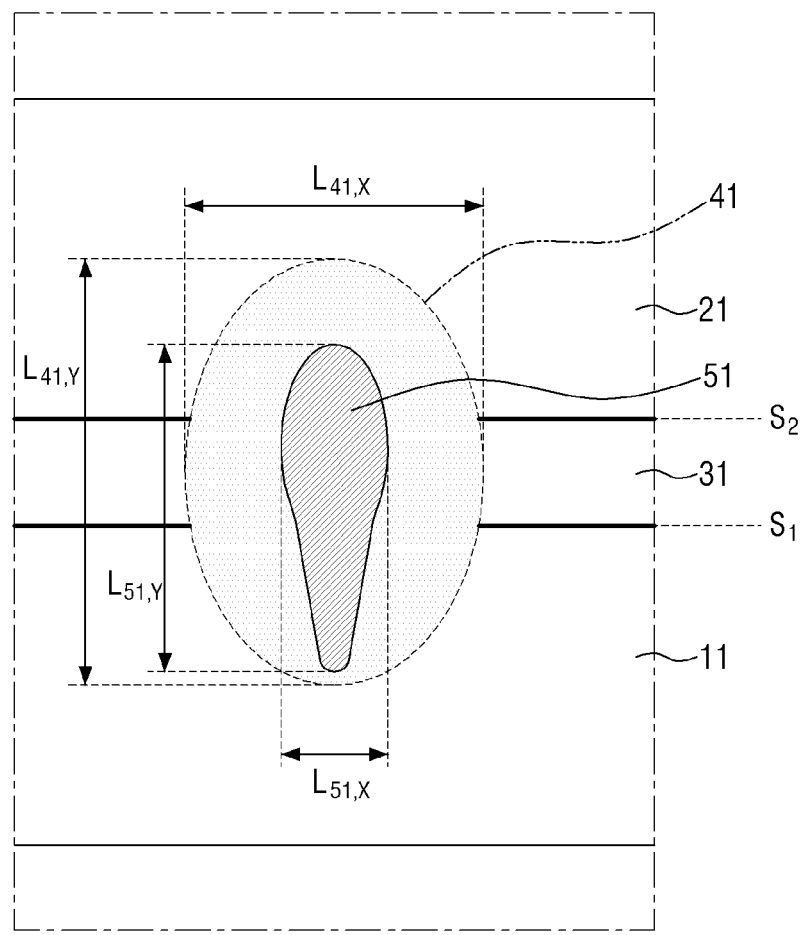
FIG. 2 is an enlarged view of a joining region of FIG. 1.

FIG. 1 is a cross-sectional view of a multi-stack joined body according to an exemplary embodiment of the invention. FIG. 2 is an enlarged view of a joining region of FIG. 1.

Referring to FIGS. 1 and 2, a multi-stack joined body 1 according to this exemplary embodiment includes a first transparent member 11, a second transparent member 21 disposed on the first transparent member 11, and an intermediate layer 31 interposed between the first transparent member 11 and the second transparent member 21 and has a joining region 41 in which the first transparent member 11, the intermediate layer 31, and the second transparent member 21 are partially joined.

Each of the first transparent member 11 and the second transparent member 21 may be a transparent member having transparency. The first transparent member 11 and the second transparent member 21 may be subjected to joining to form a joined body by being joined to each other. In an exemplary embodiment, each of the first transparent member 11 and the second transparent member 21 may be a glass member or quartz member including an amorphous solid material, e.g., an amorphous inorganic material, for example. As a non-limiting example, the first transparent member 11 or the second transparent member 21 may include about 60.0 weight percent (weight %) to about 85.0 weight % of silicon oxide (SiO, $SiO_2$, or $Si_3O_2$), about 2.0 weight % to about 20.0 weight % of aluminum oxide ($Al_2O_3$), and about 0.1 weight % to about 15.0 weight % of boron oxide ($B_2O_2$, $B_2O_3$, $B_4O_3$, or $B_4O_5$). Compositions of the first transparent member 11 and the second transparent member 21 may be the same as or different from each other. According to an exemplary embodiment, the first transparent member 11 and the second transparent member 21 may include a material with no linear absorption in a specific wavelength band of a laser.

Both the first transparent member 11 and the second transparent member 21 may be in the form of a substrate having a flat surface. According to another exemplary embodiment, one or more of the first transparent member 11 and the second transparent member 21 may have a curved surface. According to still another exemplary embodiment, the first transparent member 11 and the second transparent member 21 may have flexibility.

The intermediate layer 31 may be disposed between the first transparent member 11 and the second transparent member 21. The intermediate layer 31 may be disposed to be adjacent to the first transparent member 11 and the second transparent member 21.

According to an exemplary embodiment, the intermediate layer 31 may include a material that has transparency and is easy to be joined to the first transparent member 11 and the second transparent member 21 by melting. The intermediate layer 31 may also include a material with no linear absorption in a specific wavelength band of laser. The intermediate layer 31 may include a material that is different from that of the first transparent member 11 and the second transparent member 21.

In an exemplary embodiment, the intermediate layer 31 may include an inorganic material including silicon oxide ($SiO_x$), silicon nitride ($SiN_x$), or silicon oxynitride ($SiO_xN_y$), for example. According to another exemplary embodiment, the intermediate layer 31 may include a metal material including silver, gold, platinum, copper, aluminum, molybdenum, titanium, an alloy thereof, a metal oxide thereof, a metal nitride thereof, or the like, for example. An example of the metal oxide may include aluminum oxide ($Al_xO_y$). Because the inorganic material and the metal material have excellent adhesiveness with the first transparent member 11 and the second transparent member 21 and may form a stable state after melting, the inorganic material and the metal material may improve the joining strength between the first transparent member 11 and the second transparent member 21. That is, the intermediate layer 31 may serve as a buffer layer which forms a uniform joining line of the multi-stack joined body 1. Also, because gas permeability is low at the joining interface even after joining, when, for example, the multi-stack joined body 1 is used as a sealing member, the multi-stack joined body 1 has an excellent characteristic of sealing a component therein.

According to some exemplary embodiments, the intermediate layer 31 may further include one or more inorganic crystalline materials of a phosphate such as potassium dihydrogen phosphate ("KDP"), ammonium dihydrogen phosphate ("ADP"), and potassium titanyl phosphate ("KTP"), an arsenate such as rubidium dihydrogen arsenate ("RDA"), a borate such as β-barium borate ("BBO") and lithium triborate, germanium sulfide such as $AgGeS_2$, indium selenide such as lithium selenoindate (LiInSe2), and cadmium selenide.

The first transparent member 11 and the second transparent member 21 may be spaced apart from each other in a second direction Y. The intermediate layer 31 may be disposed in a gap between the first transparent member 11 and the second transparent member 21, and contact the first transparent member 11 and the second transparent member 21. The intermediate layer 31 may improve interlayer adhesiveness in the joining region 41, which will be described below, of the multi-stack joined body 1. In an exemplary embodiment, the joining strength can be improved with superior adhesiveness in a case in which the first transparent member 11 contacts the intermediate layer 31 and the second transparent member 21 contacts the intermediate layer 31 compared to a case in which the first transparent member 11 and the second transparent member 21 directly contact each other, for example.

In an exemplary embodiment, a lower limit of a distance $t_{31}$ between the first transparent member 11 and the second transparent member 21, that is, a thickness of the intermediate layer 31 in the second direction Y, may be about 2.0 micrometers (μm), about 2.5 μm, about 3.0 μm, about 3.5 μm, about 4.0 μm, or about 5.0 μm, for example. When the thickness of the intermediate layer 31 (that is, the distance $t_{31}$ between the first transparent member 11 and the second transparent member 21) is equal to or greater than about 2.0 μm, the intermediate layer 31 may have a thickness that may contribute to improvement in interlayer adhesiveness in the joining region 41. Although an upper limit of the distance $t_{31}$ between the first transparent member 11 and the second transparent member 21 is not particularly limited, the upper limit may be about 200 μm, about 150 μm, about 100 μm, or about 50 μm, for example.

According to an exemplary embodiment, the first transparent member 11, the intermediate layer 31, and the second transparent member 21 that are stacked together may be partially joined to each other and unitary. That is, a separate adhesive layer or sticky layer may not be provided between the first transparent member 11, the intermediate layer 31, and the second transparent member 21, and the first transparent member 11, the intermediate layer 31, and the second transparent member 21 may directly contact each other and be coupled. In an exemplary embodiment, the joining region 41 with substantially no physical boundary between the first transparent member 11, the intermediate layer 31, and the second transparent member 21 may be provided in the multi-stack joined body 1, and the first transparent member 11, the intermediate layer 31, and the second transparent member 21 may be partially welded and coupled to each other within the joining region 41. In the specification, when it is described that a physical boundary is not provided or substantially not provided between two components, it means that a physical interface capable of physically partitioning the two components from each other is not provided. Although a physical interface is not provided at a portion of the joining region 41 adjacent to the first transparent member 11, the intermediate layer 31, and the second transparent member 21, a trace that can be seen by visual inspection may remain due to a differences in material composition from that of the first transparent member 11, the intermediate layer 31, and the second transparent member 21. The shape of the trace may be substantially elliptical when seen from a cross-section cut along a first direction X.

As will be described below in relation to a method of manufacturing a multi-stack joined body, the joining region 41 may substantially match a heat dissipation region which is affected by thermal energy generated due to laser irradiation. The joining region 41 may be a region provided as the first transparent member 11, the intermediate layer 31, and the second transparent member 21 are partially melted and then coagulated. That is, the joining region 41 may be a melting zone or a welding zone.

The joining region 41 may be provided across the first transparent member 11, the intermediate layer 31, and the second transparent member 21. In the specification, when it is described that something is provided across certain components or is disposed across certain components, it means that something is connected across a space provided by the components. That is, the joining region 41 may be connected across the first transparent member 11, the intermediate layer 31, and the second transparent member 21 without being interrupted in the middle.

A light transmittance, a refractive index, and/or a density of the joining region 41 may be different from a light transmittance, a refractive index, and/or a density of each of the first transparent member 11, the intermediate layer 31, and the second transparent member 21. Also, a material composition of a portion constituting the joining region 41 may be different from a material composition of each of the first transparent member 11, the intermediate layer 31, and the second transparent member 21. That is, a deformed portion in which changes in optical characteristics such as light transmittance and refractive index and/or characteristics such as density and composition has occurred, i.e., the joining region 41, may be provided to pass through the intermediate layer 31.

Specifically, a portion forming a contact surface $S_1$ at which a physical boundary is provided and a portion in which a physical boundary is substantially not provided are provided between the first transparent member 11 and the intermediate layer 31. The portion in which a physical boundary is substantially not provided may form a portion of the joining region 41. In an exemplary embodiment, in a portion of the joining region 41, a material of the first transparent member 11 and a glass material of the intermediate layer 31 may be at least partially mixed, and an interface between the first transparent member 11 and the intermediate layer 31 may disappear, for example. As a non-limiting example, at least a portion of the material of the first transparent member 11 may infiltrate into the intermediate layer 31 and be melted and mixed with the material of the intermediate layer 31, or at least a portion of the material of the intermediate layer 31 may infiltrate into the first transparent member 11 and be melted and mixed with the material of the first transparent member 11.

Similarly, a portion forming a contact surface $S_2$ at which a physical boundary is provided and a portion in which a physical boundary is substantially not provided are provided between the second transparent member 21 and the intermediate layer 31. The portion in which a physical boundary is substantially not provided may form a portion of the joining region 41. In an exemplary embodiment, in a portion of the joining region 41, a material of the second transparent member 21 and a glass material of the intermediate layer 31 may be at least partially mixed, and an interface between the second transparent member 21 and the intermediate layer 31 may disappear, for example. As a non-limiting example, at least a portion of the material of the second transparent member 21 may infiltrate into the intermediate layer 31 and be melted and mixed with the material of the intermediate layer 31, or at least a portion of the material of the intermediate layer 31 may infiltrate into the second transparent member 21 and be melted and mixed with the material of the second transparent member 21.

In this way, the joining region 41 in which the first transparent member 11, the intermediate layer 31, and the second transparent member 21 are directly connected to each other without a physical interface and are unitary may be provided. The multi-stack joined body 1 according to this exemplary embodiment may exhibit extremely low gas permeability despite joining the plurality of transparent members 11 and 21. Also, by forming the joining region 41 having a structure in which the first transparent member 11 and the second transparent member 21 are unitary without a physical interface therebetween, that is, in which the first transparent member 11 and the second transparent member 21 are directly connected to each other by the intermediate layer 31 interposed therebetween, the multi-stack joined body 1 may have an excellent joining strength. In an exemplary embodiment, compared to joining using a sealant, joining using glass frit, or joining using glass powder in which a physical interface between members that are subjected to joining is maintained even after joining, for example, the multi-stack joined body 1 including the joining region 41 that has a structure in which members subjected to joining are directly connected to each other may have a remarkably superior joining strength. Although a joining strength per unit area at a joining portion may be about 100 megapascals (MPa) or higher in the multi-stack joined body 1 according to this exemplary embodiment, the invention is not limited thereto.

According to an exemplary embodiment, a seed-shaped structure 51 having a long axis and a short axis may be provided in the joining region 41. Although the seed-shaped structure 41 may be provided in a process of joining the first transparent member 11, the second transparent member 21, and the intermediate layer 31, the invention is not limited thereto. A length of the seed-shaped structure 51 in a long-axis direction (that is, the second direction Y) may be greater than a length thereof in a short-axis direction (that is, the first direction X). Although the long axis of the seed-shaped structure 51 may be arranged in a direction perpendicular to an interface between the first transparent member 11 and the intermediate layer 31 and an interface between the second transparent member 21 and the intermediate layer 31, the invention is not limited thereto. The seed-shaped structure 51 may be disposed across the first transparent member 11, the intermediate layer 31, and the second transparent member 21.

In an exemplary embodiment, a maximum length $L_{51,Y}$, i.e., the length $L_{51,Y}$ in the long-axis direction (for example, the second direction Y), of the seed-shaped structure 51 may be about 50 μm to about 150 μm or about 60 μm to about 120 μm, for example. When the maximum length $L_{51,Y}$ of the seed-shaped structure 51 is equal to or greater than about 50 μm, the joining region 41 may be provided across the first transparent member 11, the intermediate layer 31, and the second transparent member 21.

A minimum length $L_{51,X}$, i.e., the length $L_{51,X}$ in the short-axis direction (for example, the first direction X), of the seed-shaped structure 51 may be about $\frac{1}{20}$ to $\frac{1}{5}$ of the maximum length $L_{51,Y}$ of the seed-shaped structure 51. In an exemplary embodiment, the minimum length $L_{51,X}$ of the seed-shaped structure 51 may be about 5 μm to about 20 μm or about 10 μm to about 15 μm, for example.

However, the invention is not limited thereto, and the size of the seed-shaped structure 51 in the joining region 41 may be different according to another exemplary embodiment. According to still another exemplary embodiment, the seed-shaped structure 51 may not be provided or may not be seen by visual inspection despite of being provided.

As described above, the joining region 41 may be provided across the first transparent member 11, the intermediate layer 31, and the second transparent member 21. That is, a length $L_{41,Y}$ of the joining region 41 in the second direction Y may be larger than the thickness $t_{31}$ of the intermediate layer 31. In an exemplary embodiment, the length $L_{41,Y}$ of the joining region 41 in the second direction Y may be about 100 μm to about 250 μm or about 150 μm to about 200 μm, for example. As a non-limiting example, the length $L_{41,Y}$ of the joining region 41 in the second direction Y may be about 1 time to 4 times the maximum length $L_{51,Y}$ of the seed-shaped structure 51, for example.

The length $L_{41,X}$ of the joining region 41 in the first direction X may define a width of a joining portion of the multi-stack joined body 1. A length $L_{41,X}$ of the joining region 41 in the first direction X may be smaller than the width of the intermediate layer 31. Also, the length $L_{41,X}$ of the joining region 41 in the first direction X may be smaller than the length $L_{41,Y}$ of the joining region 41 in the second direction Y. In an exemplary embodiment, the length $L_{41,X}$ of the joining region 41 in the first direction X may be about 50 μm to about 150 μm, about 60 μm to about 120 μm, or about 70 μm to about 100 μm, for example. As a non-limiting example, the length $L_{41,X}$ of the joining region 41 in the first direction X may be about 5 times to about 15 times the minimum length $L_{51,X}$ of the seed-shaped structure 51.

Although not illustrated in the drawings, the joining region 41 may be provided in a shape extending in a third direction perpendicular to the first direction X and the second direction Y, and the seed-shaped structure 51 may be provided in a shape extending in a third direction perpendicular to the first direction X and the second direction Y.

Hereinafter, other exemplary embodiments of the invention will be described. However, description of components the same as those in FIG. 1 and the like will be omitted, and this will be clearly understood by one of ordinary skill in the art from the accompanying drawings.

Figure 3:
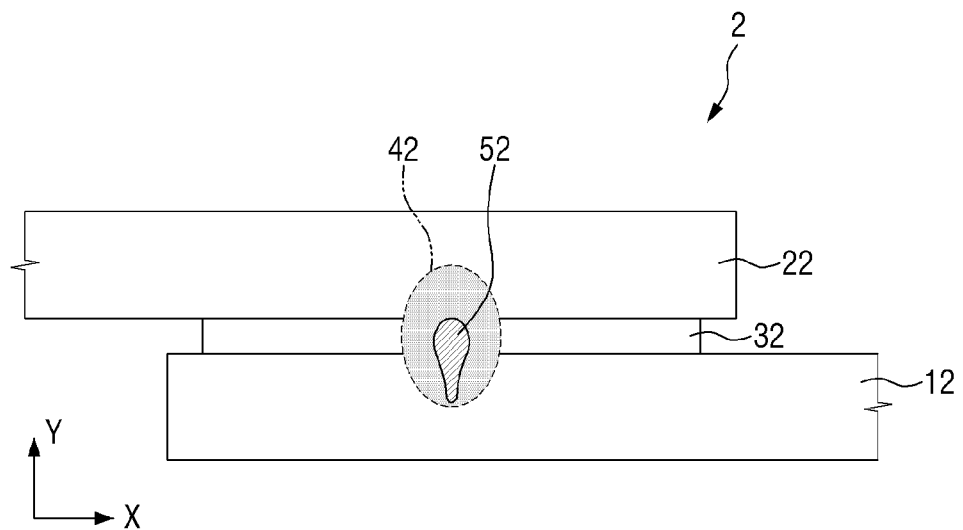
FIG. 3 is a cross-sectional view of another exemplary embodiment of a multi-stack joined body according to the invention.

FIG. 3 is a cross-sectional view of a multi-stack joined body according to another exemplary embodiment of the invention.

Referring to FIG. 3, a joining region 42 of a multi-stack joined body 2 according to this exemplary embodiment is provided across a first transparent member 12, an intermediate layer 32, and a second transparent member 22 and is different from the multi-stack joined body according to the exemplary embodiment of FIG. 1 and the like in that a seed-shaped structure 52 is disposed across only the first transparent member 12 and the intermediate layer 32.

The joining region 42 in which a physical boundary is substantially not provided between the first transparent member 12, the intermediate layer 32, and the second transparent member 22 may be provided in the multi-stack joined body 2. That is, the joining region 42 in which the first transparent member 12, the intermediate layer 32, and the second transparent member 22 are directly connected to each other without a physical interface and unitary may be provided.

The seed-shaped structure 52 having a long axis and a short axis may be provided in the joining region 42. Although the long axis of the seed-shaped structure 52 may be arranged in a direction perpendicular to an interface between the first transparent member 12 and the intermediate layer 32 and an interface between the second transparent member 22 and the intermediate layer 32, the invention is not limited thereto. According to an exemplary embodiment, the seed-shaped structure 52 may be disposed across only the first transparent member 12 and the intermediate layer 32 and may not be disposed in the second transparent member 22.

The multi-stack joined body 2 according to this exemplary embodiment may have the joining region 42 provided across the first transparent member 12, the intermediate layer 32, and the second transparent member 22 while the size of the joining region 42 in the second direction Y is minimized. In this way, changes in light transmittance, refractive index, and/or density and material composition of the first transparent member 12 and the second transparent member 22 may be minimized in the vicinity of the joining region 42 of the multi-stack joined body 2.

Figure 4:
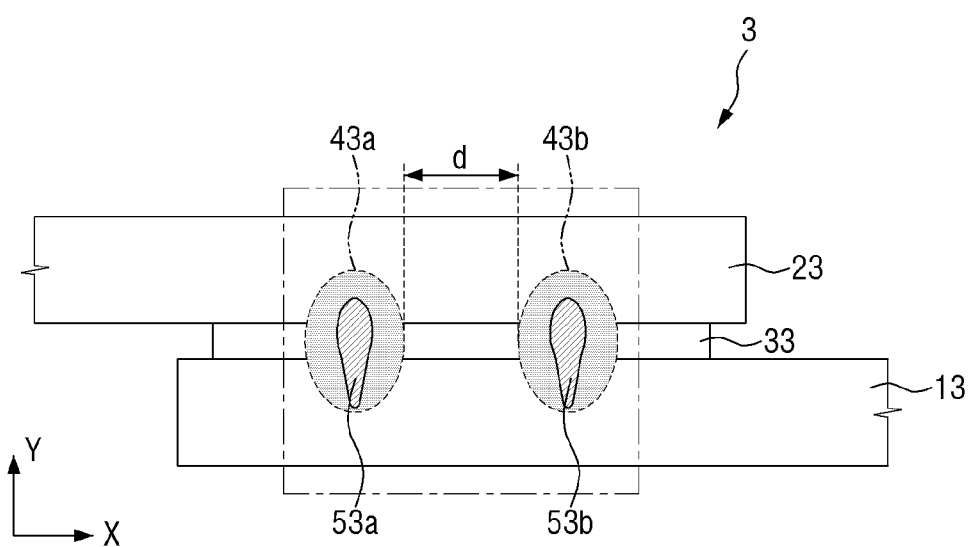
FIGS. 4 to 7 are views of other exemplary embodiments of multi-stack joined bodies according to the invention.
Figure 5:
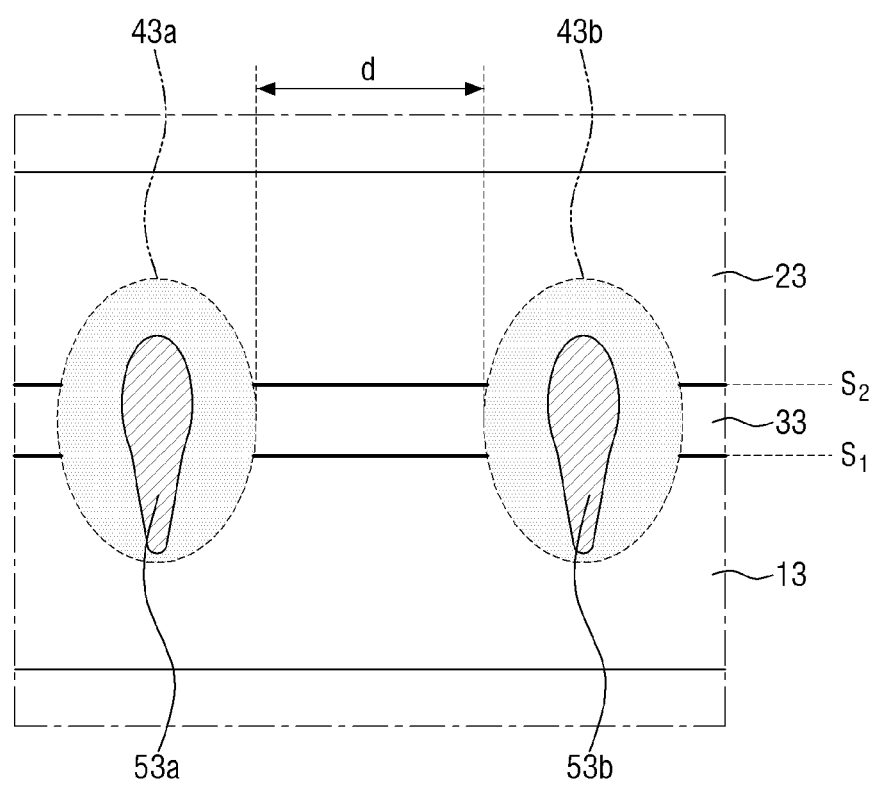

FIG. 4 is a cross-sectional view of a multi-stack joined body according to still another exemplary embodiment of the invention. FIG. 5 is an enlarged view of a joining region of FIG. 4.

Referring to FIGS. 4 and 5, a multi-stack joined body 3 according to this exemplary embodiment is different from the multi-stack joined body according to the exemplary embodiment of FIG. 1 and the like in that the multi-stack joined body 3 includes a plurality of joining regions 43a and 43b when seen from a cross-sectional view along the first direction X.

The joining regions 43a and 43b may include a first joining region 43a and a second joining region 43b spaced apart from the first joining region 43a in the first direction X. Each of the first joining region 43a and the second joining region 43b may be provided across a first transparent member 13, an intermediate layer 33, and a second transparent member 23. The first transparent member 13, the intermediate layer 33, and the second transparent member 23 may be partially welded and coupled to each other within the first joining region 43a and the second joining region 43b. A first seed-shaped structure 53a may be provided in the first joining region 43a, and a second seed-shaped structure 53b may be provided in the second joining region 43b.

Specifically, two portions in which a physical boundary is substantially not provided and a portion disposed between the two portions and forming the contact surface $S_1$ at which a physical boundary is provided may be provided between the first transparent member 13 and the intermediate layer 33. The two portions in which a physical boundary is not provided may form a portion of the first joining region 43a and a portion of the second joining region 43b, respectively.

Similarly, two portions in which a physical boundary is substantially not provided and a portion disposed between the two portions and forming the contact surface $S_2$ at which a physical boundary is provided may be provided between the second transparent member 23 and the intermediate layer 33. The two portions in which a physical boundary is not provided may form a portion of the first joining region 43a and a portion of the second joining region 43b, respectively.

In an exemplary embodiment, a lower limit of a distance d between the first joining region 43a and the second joining region 43b in the first direction X may be about 10 μm or about 15 μm, for example, but the invention is not limited thereto. In an exemplary embodiment, when the distance d between the first joining region 43a and the second joining region 43b is equal to or greater than about 10 μm, a joining strength and durability of the multi-stack joined body 3 may be improved.

As will be described below in relation to the method of manufacturing a multi-stack joined body, the first joining region 43a and the second joining region 43b may be regions to which heat generated by a laser is transmitted. When forming each of the first joining region 43a and the second joining region 43b, by spacing apart the first joining region 43a and the second joining region 43b from each other by about 10 μm or more, for example, heat generated from any one of the first joining region 43a and the second joining region 43b may be prevented from affecting a physical/chemical structure of the other in the process of forming the first joining region 43a and the second joining region 43b. Although the invention is not limited thereto, when the first joining region 43a and the second joining region 43b overlap each other, damage to the joining regions may occur in a process in which the joining regions are melted and coagulated several times. That is, by spacing apart the first joining region 43a and the second joining region 43b from each other and preventing the first joining region 43a and the second joining region 43b from overlapping, a crack or the like that is generated in an overlapping portion may be prevented.

Although not illustrated in the drawings, the first joining region 43a and the second joining region 43b may be provided in a shape extending in a third direction perpendicular to the first direction X and the second direction Y, and the first seed-shaped structure 53a and the second seed-shaped structure 53b may be provided in a shape extending in a third direction perpendicular to the first direction X and the second direction Y.

Figure 6:
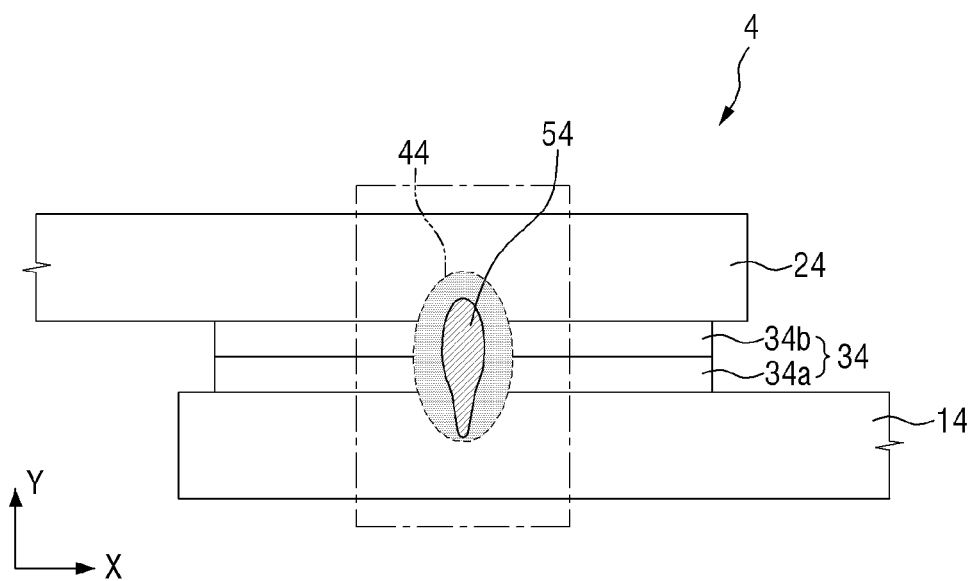
Figure 7:
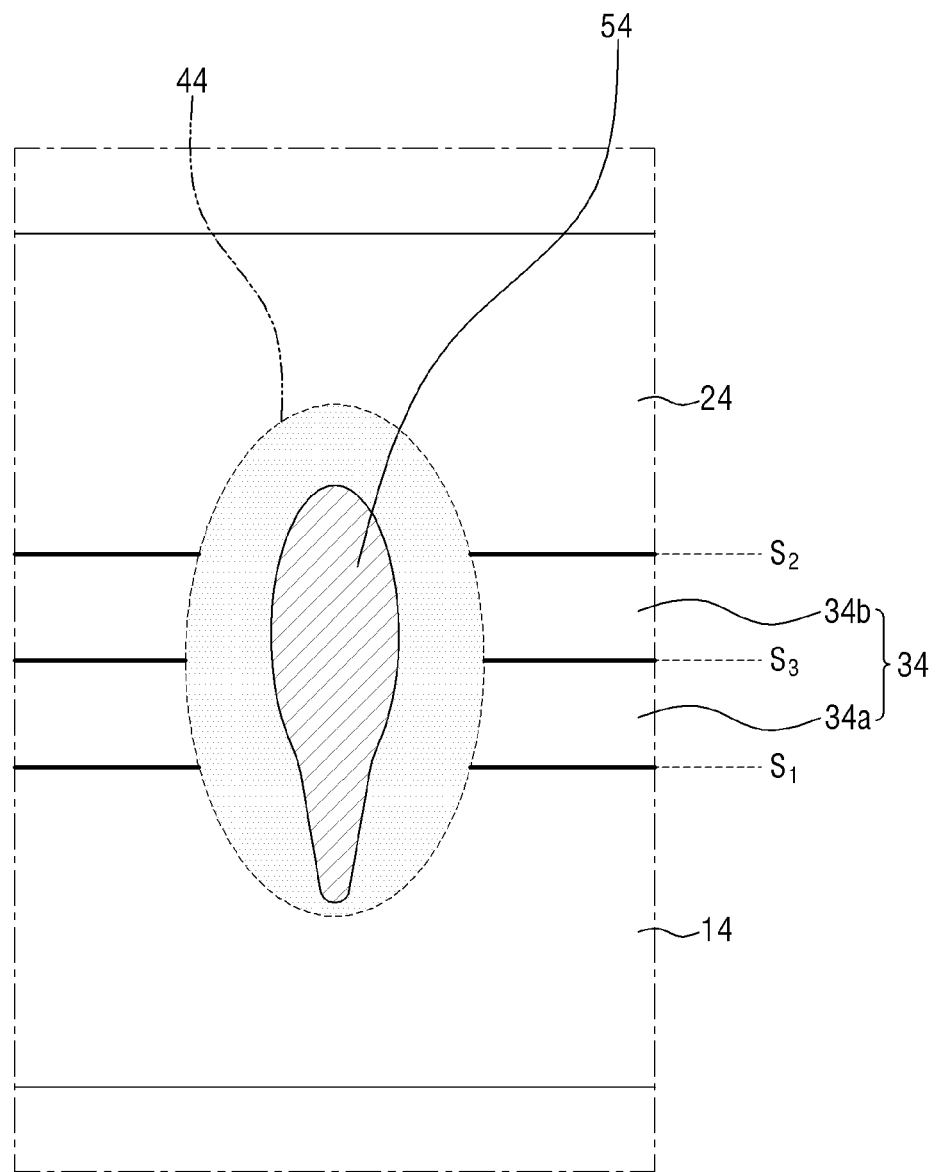

FIG. 6 is a cross-sectional view of a multi-stack joined body according to another exemplary embodiment of the invention. FIG. 7 is an enlarged view of a joining region of FIG. 6.

Referring to FIGS. 6 and 7, a multi-stack joined body 4 according to this exemplary embodiment is different from the multi-stack joined body according to the exemplary embodiment of FIG. 1 and the like in that an intermediate layer 34 of the multi-stack joined body 4 includes a structure in which a plurality of layers are stacked.

The intermediate layer 34 may include a first intermediate layer 34a and a second intermediate layer 34b that are stacked together. Although FIG. 6 illustrates a case in which the intermediate layer 34 includes a structure in which two layers are stacked, the intermediate layer 34 may include a structure in which three or more layers are stacked according to another exemplary embodiment.

The first intermediate layer 34a may contact a first transparent member 14 with a contact surface interposed therebetween. Also, the second intermediate layer 34b may contact the first intermediate layer 34a and contact a second transparent member 24 with a contact surface interposed therebetween.

In an exemplary embodiment, each of the first intermediate layer 34a and the second intermediate layer 34b may include an inorganic material including aluminum oxide ($Al_xO_y$), silicon oxide ($SiO_x$), silicon nitride ($SiN_x$), or silicon oxynitride ($SiO_xN_y$), for example. According to another exemplary embodiment, each of the first intermediate layer 34a and the second intermediate layer 34b may include a metal material such as silver, gold, platinum, copper, aluminum, and molybdenum, for example. According to some exemplary embodiments, each of the first intermediate layer 34a and the second intermediate layer 34b may further include one or more inorganic crystalline materials of a phosphate, an arsenate, a borate, germanium sulfide, indium selenide, and cadmium selenide, for example. The first intermediate layer 34a and the second intermediate layer 34b may include materials that are the same as or different from each other, and a physical boundary may be provided between the first intermediate layer 34a and the second intermediate layer 34b.

According to an exemplary embodiment, the first transparent member 14, the first intermediate layer 34a, the second intermediate layer 34b, and the second transparent member 24 may be partially joined to each other and unitary. That is, a separate adhesive layer or sticky layer may not be provided between the first transparent member 14, the first intermediate layer 34a, the second intermediate layer 34b, and the second transparent member 24, and the first transparent member 14, the first intermediate layer 34a, the second intermediate layer 34b, and the second transparent member 24 may directly contact each other and be coupled. In this case, a joining region 44 may be provided across the first transparent member 14, the first intermediate layer 34a, the second intermediate layer 34b, and the second transparent member 24.

Specifically, a portion forming the contact surface $S_1$ at which a physical boundary is provided and a portion in which a physical boundary is substantially not provided are provided between the first transparent member 14 and the first intermediate layer 34a. The portion in which a physical boundary is substantially not provided may form a portion of the joining region 44.

Similarly, a portion forming the contact surface $S_2$ at which a physical boundary is provided and a portion in which a physical boundary is substantially not provided are provided between the second transparent member 24 and the second intermediate layer 34b. The portion in which a physical boundary is substantially not provided may form a portion of the joining region 44.

Also, a portion forming a contact surface $S_3$ at which a physical boundary is provided and a portion in which a physical boundary is substantially not provided are provided between the first intermediate layer 34a and the second intermediate layer 34b. The portion in which a physical boundary is substantially not provided may form a portion of the joining region 44.

In this way, the joining region 44 in which the first transparent member 14, the first intermediate layer 34a, the second intermediate layer 34b, and the second transparent member 24 are directly connected to each other without a physical interface and are unitary may be provided.

According to an exemplary embodiment, a seed-shaped structure 54 having a long axis and a short axis may be provided in the joining region 44. The seed-shaped structure 54 may be disposed across the first transparent member 14 and the first intermediate layer 34a, may be disposed across the first transparent member 14, the first intermediate layer 34a, and the second intermediate layer 34b, or may be disposed across the first transparent member 14, the first intermediate layer 34a, the second intermediate layer 34b, and the second transparent member 24.

The multi-stack joined body 4 according to this exemplary embodiment may sufficiently secure a distance between the first transparent member 14 and the second transparent member 24 by including the intermediate layer 34 having a structure in which a plurality of layers are stacked. That is, by forming the intermediate layer 34 including the first intermediate layer 34a and the second intermediate layer 34b, the intermediate layer 34 may be allowed to have a sufficient height. In this way, joining stability may be further improved.

Hereinafter, the method of manufacturing a multi-stack joined body according to the invention will be described.

FIGS. 8 to 11 are views for describing a method of manufacturing a multi-stack joined body according to an exemplary embodiment of the invention.

Figure 8:
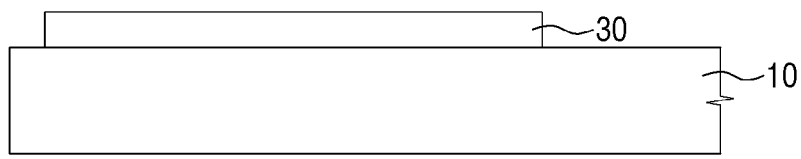
FIGS. 8 to 11 are views for describing an exemplary embodiment of a method of manufacturing a multi-stack joined body according to the invention.

First, referring to FIG. 8, a stacked body that includes a first transparent member 10 and an intermediate layer 30 disposed on the first transparent member 10 is prepared. The preparing of the stacked body of the first transparent member 10 and the intermediate layer 30 may include preparing the first transparent member 10 and directly forming the intermediate layer 30 on the first transparent member 10.

According to an exemplary embodiment, the forming of the intermediate layer 30 may include depositing a material for forming the intermediate layer 30 using a physical vapor deposition method. When the physical vapor deposition method is used, because a thickness of the intermediate layer 30 may be easily controlled, the intermediate layer 30 may be provided to have a sufficient thickness. According to the exemplary embodiment in which the intermediate layer 30 is provided using the physical vapor deposition method, an example of the material for forming the intermediate layer 30 may include a metal material including silver, gold, platinum, copper, aluminum, molybdenum, titanium, an alloy thereof, a metal oxide thereof, a metal nitride thereof, or the like, for example.

According to another exemplary embodiment, the forming of the intermediate layer 30 may include depositing a material for forming the intermediate layer 30 using a chemical vapor deposition ("CVD") method. When the CVD method is used, because a surface of the intermediate layer 30 may be easily controlled, adhesiveness between the intermediate layer 30 and a second transparent member 20, which will be described below, may be improved. According to the exemplary embodiment in which the intermediate layer 30 is provided using the CVD method, an example of the material for forming the intermediate layer 30 may include an inorganic material including silicon oxide ($SiO_x$), silicon nitride ($SiN_x$), or silicon oxynitride ($SiO_xN_y$).

Figure 9:
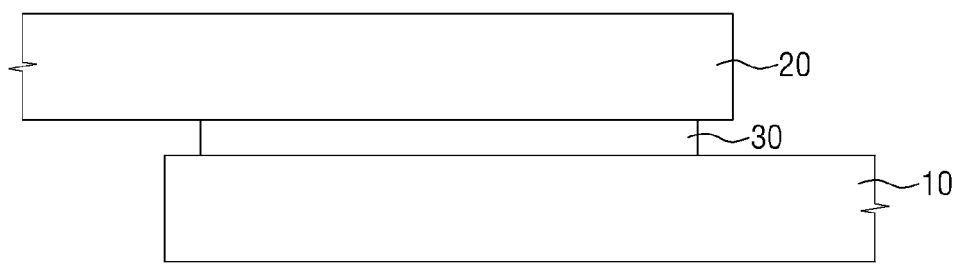

Next, referring to FIG. 9, the second transparent member 20 is disposed on the intermediate layer 30 to prepare a stacked body of the first transparent member 10, the intermediate layer 30, and the second transparent member 20. The preparing of the stacked body of the first transparent member 10, the intermediate layer 30, and the second transparent member 20 may include disposing the second transparent member 20 on the intermediate layer 30 and adhering the intermediate layer 30 with the second transparent member 20 by applying pressure to the second transparent member 20.

Figure 10:
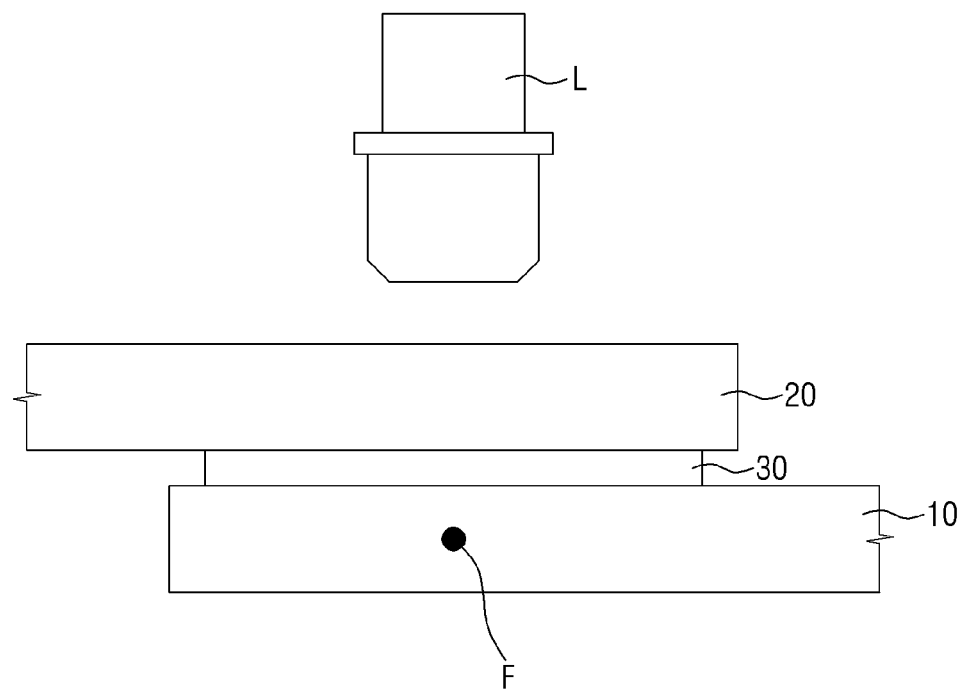

Next, referring to FIG. 10, a laser L is disposed on the second transparent member 20 and a focus F is provided. The focus F of the laser L may be provided in the first transparent member 10. That is, the focus F may be provided in a member subjected to joining that is placed farther from a position of the laser L of the first transparent member 10 and the second transparent member 20.

According to an exemplary embodiment, the laser L may be a pulsed laser, for example. The pulsed laser may have better temporal focusing performance of energy compared to a continuous wave laser. The pulsed laser, e.g., a laser having a short pulse width, may cause a nonlinear absorption phenomenon in a transparent medium due to high output. In this way, energy transmission may be localized, and a change in physical/chemical property of the transparent medium may be minimized. In an exemplary embodiment, the laser L may be a microwave laser having a pulse width in a range of 10 fs (femtoseconds) to 50 fs, for example.

Figure 11:
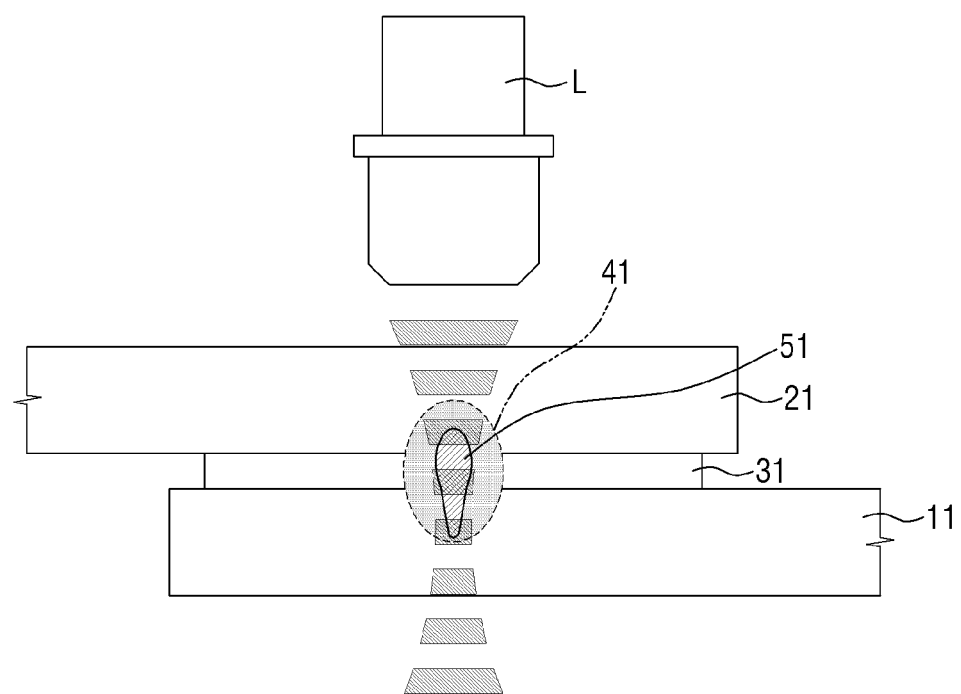

Next, referring to FIG. 11, the laser L is irradiated to sequentially pass through the second transparent member 21 and the intermediate layer 31 to form the joining region 41. As described above, the laser L may be a microwave laser capable of inducing the nonlinear absorption phenomenon.

When the focus is provided in the first transparent member 11 and the laser L is irradiated, intensive energy is transmitted to the vicinity of the focus, and the laser L may be, for example, converted into thermal energy. Conversely, even though the laser L passes through the second transparent member 21, changes in light transmittance, refractive index, density and/or physical/chemical properties such as material composition may substantially not occur in portions of the second transparent member 21 other than the intended joining region 41 due to the nonlinear absorption phenomenon.

According to an exemplary embodiment, thermal energy generated due to the laser L may partially melt the first transparent member 11, the intermediate layer 31, and the second transparent member 21 and form the joining region 41 with substantially no physical boundary between the first transparent member 11, the intermediate layer 31, and the second transparent member 21. In an exemplary embodiment, due to dissipation of thermal energy, temperature of the stacked body of the first transparent member 11, the intermediate layer 31, and the second transparent member 21 locally increases to about 500 degrees Celsius (° C.) to about 3,000° C., and the first transparent member 11, the intermediate layer 31, and the second transparent member 21 may be welded and coupled to each other, for example. That is, the joining region 41 may be a melting zone or a welding zone. Although a physical interface is not provided at a portion of the joining region 41 adjacent to the first transparent member 11, the intermediate layer 31, and the second transparent member 21, a trace that can be seen by visual inspection may be generated due to a differences in material composition from that of the first transparent member 11, the intermediate layer 31, and the second transparent member 21. The joining region 41 may be provided across the first transparent member 11, the intermediate layer 31, and the second transparent member 21.

The seed-shaped structure 51 may be provided within the joining region 41 due to irradiation of the laser L. The seed-shaped structure 51 may have a long axis and a short axis. The seed-shaped structure 51 may be provided to grow toward the second transparent member 21 from the position of the focus of the laser L described above. That is, any one end (for example, a lower end in the drawing) of the long axis of the seed-shaped structure 51 may substantially match the position of the focus, and the other end (for example, an upper end in the drawing) of the long axis of the seed-shaped structure 51 may be disposed at a level with the intermediate layer 31 or reach a level of the second transparent member 21.

Because the joining region 41 and the seed-shaped structure 51 have been described above with reference to FIG. 2 and the like, overlapping description will be omitted.

Hereinafter, a display device according to the invention will be described.

Figure 12:
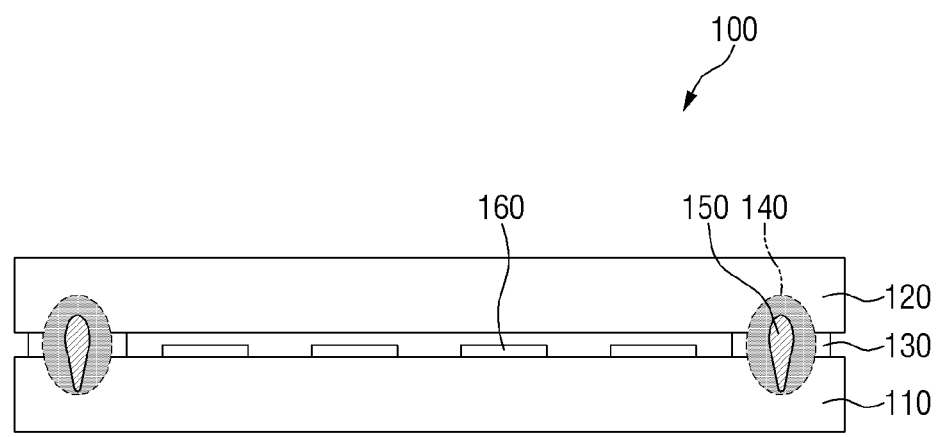
FIG. 12 is a cross-sectional view of an exemplary embodiment of a display device according to the invention.

FIG. 12 is a cross-sectional view of a display device according to an exemplary embodiment of the invention.

Referring to FIG. 12, a display device 100 may be an organic light emitting display device that includes a first substrate 110, a second substrate 120 facing the first substrate 110, and a plurality of organic light emitting elements 160 disposed between the first substrate 110 and the second substrate 120.

According to an exemplary embodiment, the first substrate 110 may be a transparent substrate having transparency. In an exemplary embodiment, the first substrate 110 may be a glass member or a quartz member, for example. The first substrate 110 may be a lower substrate. Like the first substrate 110, the second substrate 120 may be a transparent substrate. In an exemplary embodiment, the second substrate 120 may be a glass member or a quartz member, for example. The second substrate 120 may be a substrate facing the first substrate 110 and may be a sealing substrate capable of sealing the organic light emitting elements 160 from the top.

The organic light emitting elements 160 may be disposed on the first substrate 110. The plurality of organic light emitting elements 160 may be disposed at positions corresponding to pixels of the display device 100. The organic light emitting element 160 may include a positive electrode (not illustrated) and a negative electrode (not illustrated) facing each other and an organic light emitting layer (not illustrated) interposed therebetween.

An intermediate layer 130 may be interposed between the first substrate 110 and the second substrate 120. In an exemplary embodiment, the intermediate layer 130 may be disposed at edge portions of the first substrate 110 and the second substrate 120 and be disposed to at least partially surround the organic light emitting elements 160 in a plan view, for example. That is, the intermediate layer 130 may seal the organic light emitting elements 160 from the side.

The first substrate 110, the second substrate 120, and the intermediate layer 130 interposed therebetween may form a multi-stack joined body according to the exemplary embodiment described above. In an exemplary embodiment, the first substrate 110 may correspond to the first transparent member 11 of the exemplary embodiment of FIG. 1, and the second substrate 120 may correspond to the second transparent member 21 of the exemplary embodiment of FIG. 1, for example. Also, the intermediate layer 130 may correspond to the intermediate layer 31 of the exemplary embodiment of FIG. 1. Because each of the above components has been described above with reference to FIG. 1 and the like, overlapping description will be omitted.

According to an exemplary embodiment, the first substrate 110, the intermediate layer 130, and the second substrate 120 may be partially joined to each other and unitary. That is, a separate adhesive layer or sticky layer may not be provided between the first substrate 110, the intermediate layer 130, and the second substrate 120, and the first substrate 110, the intermediate layer 130, and the second substrate 120 may directly contact each other and be coupled. In an exemplary embodiment, a joining region 140 in which a physical boundary is substantially not provided between the first substrate 110, the intermediate layer 130, and the second substrate 120 may be provided, and the first substrate 110, the intermediate layer 130, and the second substrate 120 may be partially welded and coupled to each other within the joining region 140. The joining region 140 may be provided across the first substrate 110, the intermediate layer 130, and the second substrate 120.

A seed-shaped structure 150 may be provided within the joining region 140. The seed-shaped structure 150 may be generated in a process of joining the first substrate 110, the second substrate 120, and the intermediate layer 130. Because the joining region 140 and the seed-shaped structure 150 have been described above with reference to FIG. 1 and the like, overlapping description will be omitted.

Because the first substrate 110 and the second substrate 120 are welded and coupled to each other, the display device 100 according to this exemplary embodiment may have an excellent sealing performance with respect to the organic light emitting elements 160. Also, because the coupling strength is excellent, reliability and durability of the display device 100 may be improved.

In an exemplary embodiment, a lower limit of a distance between the first substrate 110 and the second substrate 120 may be about 2.0 μm, about 2.5 μm, about 3.0 μm, about 3.5 μm, about 4.0 μm, or about 5.0 μm, for example. When the distance between the first substrate 110 and the second substrate 120 is equal to or greater than about 2.0 μm, the distance may contribute to improvement in interlayer adhesiveness in the joining region 140, and a sufficient space for the organic light emitting elements 160 may be secured between the first substrate 110 and the second substrate 120. According to some exemplary embodiments, each of the thickness of the first substrate 110 and the thickness of the second substrate 120 may be equal to or greater than about 300 μm or equal to or greater than about 500 μm, for example.

Figure 13:
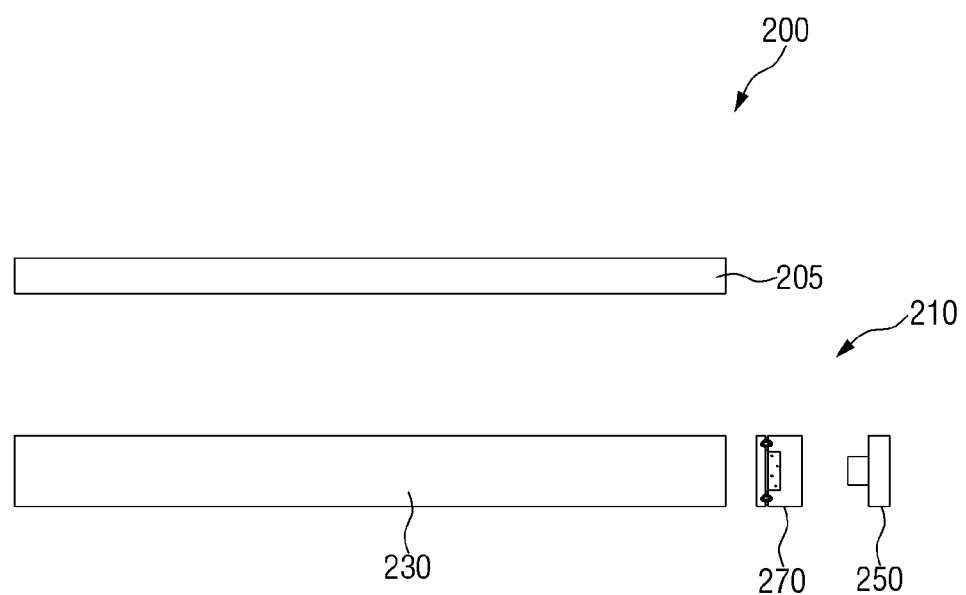
FIG. 13 is a cross-sectional view of another exemplary embodiment of a display device according to the invention.
Figure 14:
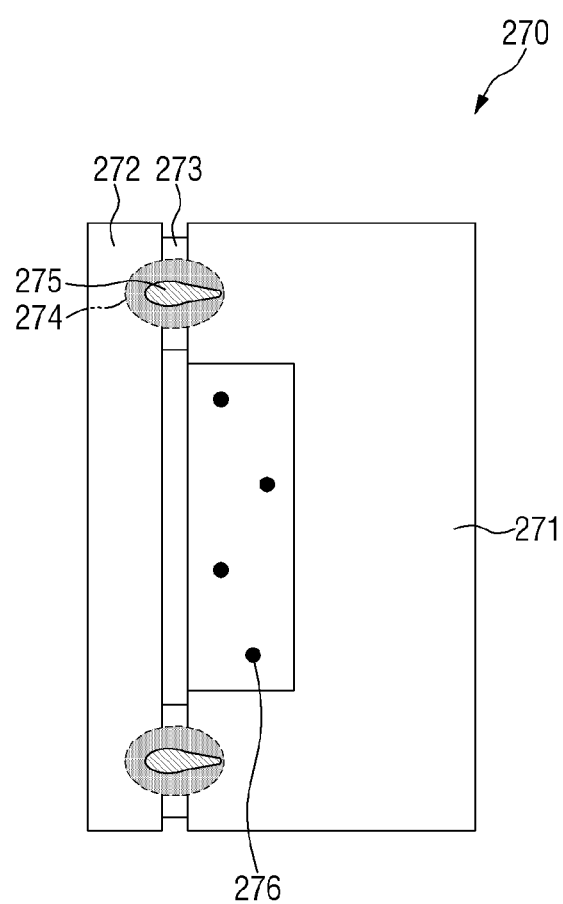
FIG. 14 is an enlarged view of a wavelength converter of FIG. 13.

FIG. 13 is a cross-sectional view of a display device according to another exemplary embodiment of the invention. FIG. 14 is an enlarged view of a wavelength converter of FIG. 13.

Referring to FIGS. 13 and 14, a display device 200 according to this exemplary embodiment may be a liquid crystal display ("LCD") device that includes a backlight unit 210 and an LCD panel 205 disposed on the backlight unit 210.

The LCD panel 205 may include an electric field generating electrode (not illustrated) and a liquid crystal layer (not illustrated). The LCD panel 205 may rearrange liquid crystal in the liquid crystal layer by applying voltage to the electric field generating electrode, and in this way, image display may be realized by controlling an amount of light passing through the liquid crystal layer for each pixel.

The backlight unit 210 may provide light having a specific wavelength to the LCD panel 205. According to an exemplary embodiment, the backlight unit 210 may include a light guide plate 230, a light source 250 disposed adjacent to the light guide plate 230, and a wavelength converter 270 disposed between the light guide plate 230 and the light source 250.

The light guide plate 230 may guide light received from the light source 250 and project the light toward the LCD panel 205. In an exemplary embodiment, a side surface of the light guide plate 230 adjacent to the light source 250 may form a light incident surface, and an upper surface of the light guide plate 230 facing the LCD panel 205 may form a light output surface. Light incident through the side surface of the light guide plate 230 may be guided toward an inside of the light guide plate 230 by partial or total reflection, and at least some of the guided light may be projected through the upper surface of the light guide plate 230. Although not illustrated in the drawings, a scattering pattern, an embossed pattern, or the like may be provided at a lower surface of the light guide plate 230.

Although a material of the light guide plate 230 is not particularly limited as long as the material has high light transmittance to guide light received from the light source 250 without loss, the light guide plate 230 may include, for example, a glass material, a quartz material, or a plastic material such as polycarbonate, polystyrene, and polyethylene terephthalate.

The light source 250 may be disposed at the side surface of the light guide plate 230. The light source 250 may be spaced apart from the side surface of the light guide plate 230 with a predetermined distance. The light source 250 may be a component which directly emits light having a specific wavelength band. In an exemplary embodiment, the light source 250 may be a light emitting diode ("LED"), for example. In an exemplary embodiment, the light source 250 may be a blue LED which emits light in a blue wavelength band or an ultraviolet LED which emits light in an ultraviolet wavelength band, for example. However, the invention is not limited thereto, and the light source 250 may include various other types of LEDs.

The wavelength converter 270 may be disposed between the light source 250 and the light incident surface of the light guide plate 230. That is, the wavelength converter 270 may be disposed on an optical path from the light source 250 to the light guide plate 230. The wavelength converter 270 may be a component which converts a wavelength of light received from the light source 250 and projects the light. The wavelength converter 270 may be spaced apart from the light source 250 with a predetermined distance. By arranging the light source 250 and the wavelength converter 270 to be spaced apart from each other, damage to the wavelength converter 270 due to heat emitted from the light source 250 may be minimized.

According to an exemplary embodiment, the wavelength converter 270 may include a wavelength converting material 276, and a first container member 271 and a second container member 272 which define a space in which the wavelength converting material 276 is accommodated. In an exemplary embodiment, an inner space in the form of a groove or a trench capable of accommodating the wavelength converting material 276 may be defined in the first container member 271, and the second container member 272 may have a plate shape and seal the inner space of the first container member 271. However, the invention is not limited thereto.

The wavelength converting material 276 may be a material which converts or shifts a peak wavelength of incident light to a specific peak wavelength and projects the light. An example of the wavelength converting material 276 may include a fluorescent material and a quantum dot material. In an exemplary embodiment, a quantum dot may emit light of specific color as an electron transitions from a conduction band to a valence band, for example. The quantum dot material may have a core-shell structure. The core may be a semiconductor nanocrystal material. An example of the quantum dot core may include a Si-based nanocrystal, a II-VI family compound nanocrystal, or a III-V family compound nanocrystal, but the invention is not limited thereto.

Each of the first container member 271 and the second container member 272 may be a transparent member with high light transmittance. In an exemplary embodiment, each of the first container member 271 and the second container member 272 may include a glass material, a quartz material, or the like, for example. An intermediate layer 273 may be interposed between the first container member 271 and the second container member 272.

The first container member 271, the second container member 272, and the intermediate layer 273 interposed therebetween may form a multi-stack joined body according to the exemplary embodiment described above. In an exemplary embodiment, the first container member 271 may correspond to the first transparent member 11 of the exemplary embodiment of FIG. 1, and the second container member 272 may correspond to the second transparent member 21 of the exemplary embodiment of FIG. 1, for example. Also, the intermediate layer 273 may correspond to the intermediate layer 31 of the exemplary embodiment of FIG. 1. Because each of the above components has been described above with reference to FIG. 1 and the like, overlapping description will be omitted.

According to an exemplary embodiment, the first container member 271, the intermediate layer 273, and the second container member 272 may be partially joined to each other and unitary. That is, a separate adhesive layer or sticky layer may not be provided between the first container member 271, the intermediate layer 273, and the second container member 272, and the first container member 271, the intermediate layer 273, and the second container member 272 may directly contact each other and be coupled. In an exemplary embodiment, a joining region 274 in which a physical boundary is substantially not provided between the first container member 271, the intermediate layer 273, and the second container member 272 may be provided, and the first container member 271, the intermediate layer 273, and the second container member 272 may be partially welded and coupled to each other within the joining region 274, for example. The joining region 274 may be provided across the first container member 271, the intermediate layer 273, and the second container member 272.

A seed-shaped structure 275 may be provided within the joining region 274. The seed-shaped structure 275 may be generated in a process of joining the first container member 271, the intermediate layer 273, and the second container member 272. Because the joining region 274 and the seed-shaped structure 275 have been described above with reference to FIG. 1 and the like, overlapping description will be omitted.

Because the first container member 271 and the second container member 272 are welded and coupled to each other, the display device 200 according to this exemplary embodiment may effectively seal the wavelength converting material 276 therein. In this way, contamination or deformation of the wavelength converting material 276 due to external moisture or impurities may be prevented, and durability and service life of the wavelength converter 270 may be improved.

Figure 15:
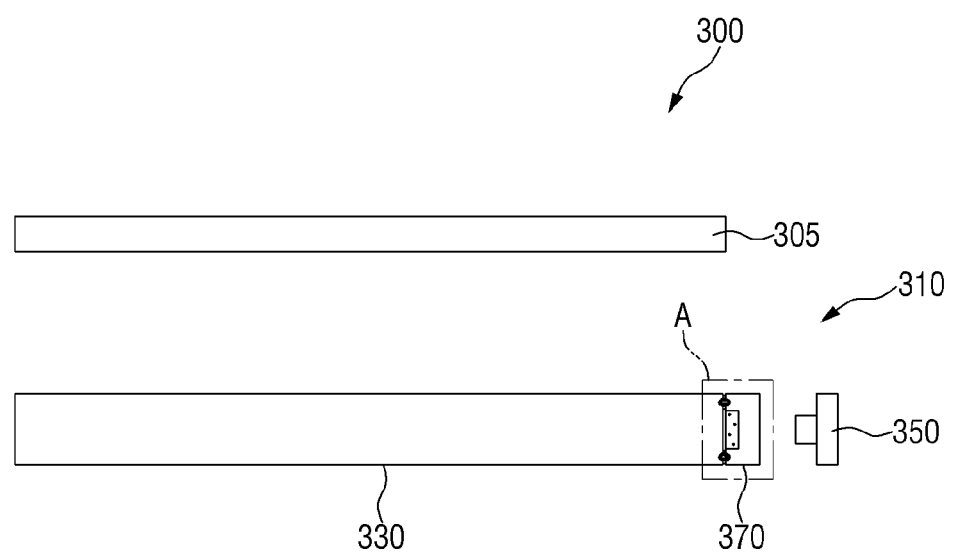
FIG. 15 is a cross-sectional view of another exemplary embodiment of a display device according to the invention.
Figure 16:
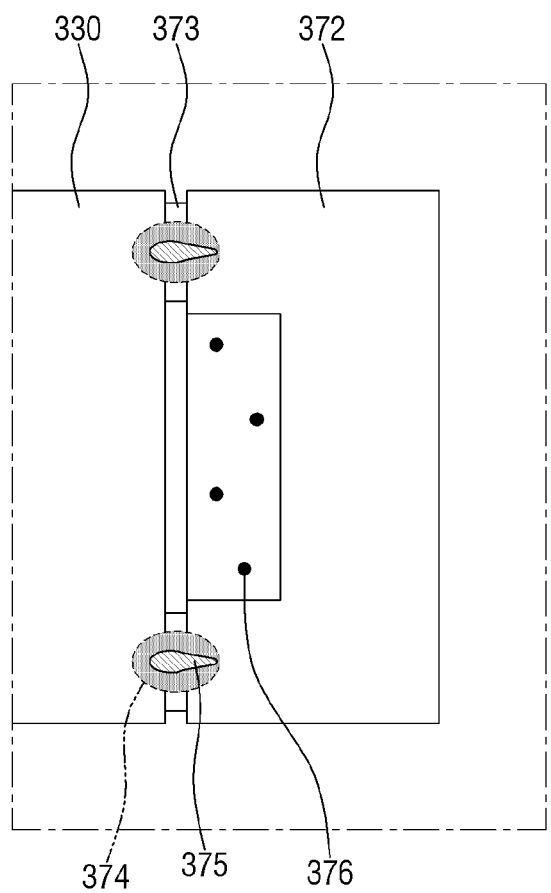
FIG. 16 is an enlarged view of portion A of FIG. 15.

FIG. 15 is a cross-sectional view of a display device according to still another exemplary embodiment of the invention. FIG. 16 is an enlarged view of portion A of FIG.

Referring to FIGS. 15 and 16, a display device 300 according to this exemplary embodiment is an LCD device that includes a backlight unit 310 and an LCD panel 305 disposed on the backlight unit 310 and is different from the LCD device according to the exemplary embodiment of FIG. 13 and the like in that a wavelength converter 370 and a light guide plate 330 are coupled to each other and unitary.

According to an exemplary embodiment, the backlight unit 310 may include the light guide plate 330, a light source 350 disposed adjacent to the light guide plate 330, and the wavelength converter 370 disposed between the light guide plate 330 and the light source 350. The light guide plate 330 may guide light received from the light source 350 and project the light toward the LCD panel 305. In an exemplary embodiment, the light guide plate 330 may include a glass material, a quartz material, or the like, for example.

The wavelength converter 370 may be disposed on an optical path from the light source 350 to the light guide plate 330. According to an exemplary embodiment, the wavelength converter 370 may include a wavelength converting material 376 and a container member 372 which define a space in which the wavelength converting material 376 is accommodated. The container member 372 may be a transparent member with high light transmittance. In an exemplary embodiment, the container member 372 may include a glass material or a quartz material, for example. An inner space in the form of a groove or a trench capable of accommodating the wavelength converting material 376 may be defined in the container member 372.

An intermediate layer 373 may be interposed between the container member 372 and the light guide plate 330. The light guide plate 330, the container member 372, and the intermediate layer 373 interposed therebetween may form a multi-stack joined body according to the exemplary embodiment described above. In an exemplary embodiment, the light guide plate 330 may correspond to the first transparent member 11 of the exemplary embodiment of FIG. 1, and the container member 372 may correspond to the second transparent member 21 of the exemplary embodiment of FIG. 1, for example. Also, the intermediate layer 373 may correspond to the intermediate layer 31 of the exemplary embodiment of FIG. 1. Because each of the above components has been described above with reference to FIG. 1 and the like, overlapping description will be omitted.

According to an exemplary embodiment, the light guide plate 330, the intermediate layer 373, and the container member 372 may be partially joined to each other and unitary. That is, a separate adhesive layer or sticky layer may not be provided between the light guide plate 330, the intermediate layer 373, and the container member 372, and the light guide plate 330, the intermediate layer 373, and the container member 372 may directly contact each other and be coupled. In an exemplary embodiment, a joining region 374 in which a physical boundary is substantially not provided between the light guide plate 330, the intermediate layer 373, and the container member 372 may be provided, and the light guide plate 330, the intermediate layer 373, and the container member 372 may be partially welded and coupled to each other within the joining region 374, for example. The joining region 374 may be provided across the light guide plate 330, the intermediate layer 373, and the container member 372.

A seed-shaped structure 375 may be provided within the joining region 374. The seed-shaped structure 375 may be generated in a process of joining the light guide plate 330, the intermediate layer 373, and the container member 372. Because the joining region 374 and the seed-shaped structure 375 have been described above with reference to FIG. 1 and the like, overlapping description will be omitted.

Because the light guide plate 330 and the container member 372 of the wavelength converter 370 are welded and coupled to each other, the display device 300 according to this exemplary embodiment may effectively seal the wavelength converting material 376 therein. Further, for example, even when an external impact is applied, an alignment between the wavelength converter 370 and the light guide plate 330 may be accurately maintained so that optical loss between the wavelength converter 370 and the light guide plate 330 is minimized and color conversion efficiency is maximized.

As a result, the multi-stack joined body according to an exemplary embodiment of the invention can improve interlayer adhesiveness at a joining interface by including an intermediate layer interposed between a first transparent member and a second transparent member, and in this way, a multi-stack joined body having an excellent joining strength can be provided.

Further, according to a method of manufacturing a multi-stack joined body according to an exemplary embodiment of the invention, a plurality of transparent members can be joined using only a relatively simple method.

Further, a display device according to an exemplary embodiment of the invention can improve reliability and durability by including a multi-stack joined body with a new structure having an excellent joining strength and low gas permeability and improve display quality.

The advantageous effects according to the exemplary embodiments of the invention are not limited to those mentioned above, and various other advantageous effects are included herein.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A multi-stack joined body comprising:
   a first transparent member;
   a second transparent member disposed on the first transparent member; and
   an intermediate layer interposed between the first transparent member and the second transparent member,
   wherein:
   a joining region in which a physical boundary is not provided between the first transparent member and the intermediate layer and between the second transparent member and the intermediate layer is provided across the first transparent member, the intermediate layer, and the second transparent member without being interrupted in a middle of the joining region.

2. The multi-stack joined body of claim 1, wherein:
   a physical boundary is provided at a part of a contact surface between the first transparent member and the intermediate layer; and
   a physical boundary is provided at a part of a contact surface between the second transparent member and the intermediate layer.

3. The multi-stack joined body of claim 1, wherein:
   a refractive index of the joining region is different from a refractive index of the first transparent member, a refractive index of the second transparent member, and a refractive index of the intermediate layer; and
   a density of the joining region is different from a density of the first transparent member, a density of the second transparent member, and a density of the intermediate layer.

4. The multi-stack joined body of claim 1, wherein:
   the first transparent member and the second transparent member are spaced apart from each other; and a distance between the first transparent member and the second transparent member is equal to or greater than about 2 micrometers (μm).

5. The multi-stack joined body of claim 1, wherein the intermediate layer includes an inorganic material including silicon oxide, silicon nitride, or silicon oxynitride or a metal material.

6. The multi-stack joined body of claim 5, wherein the intermediate layer further includes at least one inorganic crystalline materials of a phosphate, an arsenate, a borate, germanium sulfide, indium selenide, and cadmium selenide.

7. The multi-stack joined body of claim 5, wherein the first transparent member or the second transparent member includes:
  about 60.0 weight percent (weight %) to about 85.0 weight % of silicon oxide;
  about 2.0 weight % to about 20.0 weight % of aluminum oxide; and
  about 0.1 weight % to about 15.0 weight % of boron oxide.

8. The multi-stack joined body of claim 1, wherein:
  a seed-shaped structure having a long axis and a short axis is provided within the joining region; and
  the seed-shaped structure is disposed across the first transparent member and the intermediate layer.

9. The multi-stack joined body of claim 8, wherein the seed-shaped structure is also disposed across the second transparent member.

10. The multi-stack joined body of claim 8, wherein:
  a length of the seed-shaped structure in a long-axis direction is about 50 micrometers (μm) to about 150 μm;
  a length of the seed-shaped structure in a short-axis direction is about 1/20 to about 1/5 of the length of the seed-shaped structure in the long-axis direction;
  a length of the joining region in the long-axis direction is about 1 time to about 4 times the length of the seed-shaped structure in the long-axis direction, and
  a length of the joining region in the short-axis direction is about 5 times to about 15 times the length of the seed-shaped structure in the short-axis direction.

11. The multi-stack joined body of claim 1, wherein:
  the joining region includes a first joining region and a second joining region which are spaced apart from each other;
  a physical boundary is provided at a part of a contact surface between the first transparent member and the intermediate layer, which between the first joining region and the second joining region; and
  a physical boundary is provided at a part of a contact surface between the second transparent member and the intermediate layer, which between the first joining region and the second joining region.

12. The multi-stack joined body of claim 1, wherein:
  the intermediate layer includes a first intermediate layer contacting the first transparent member and a second intermediate layer partially having a physical boundary with the first intermediate layer and contacting the second transparent member;
  the first transparent member, the first intermediate layer, the second intermediate layer, and the second transparent member are partially jointed to each other and unitary; and
  the joining region is disposed across the first transparent member, the first intermediate layer, the second intermediate layer, and the second transparent member.

13. A method of manufacturing a multi-stack joined body, the method comprising:
  preparing a stacked body including a first transparent member, a second transparent member disposed on the first transparent member, and an intermediate layer interposed between the first transparent member and the second transparent member; and
  forming a joining region in which a physical boundary is not provided between the first transparent member and the intermediate layer and between the second transparent member and the intermediate layer by irradiating the stacked body with a laser,
  wherein the joining region is disposed across the first transparent member, the intermediate layer, and the second transparent member without being interrupted in a middle of the joining region.

14. The method of claim 13, wherein the forming the joining region by irradiating the laser includes:
  forming a focus of the laser in the first transparent member; and
  forming the joining region by irradiating the focus with the laser having a pulse width of about 10 femtoseconds to about 50 femtoseconds so that the laser sequentially passes through the second transparent member and the intermediate layer,
  wherein a seed-shaped structure is provided within the joining region, and
  the seed-shaped structure is provided to grow toward the second transparent member from a position of the focus.

15. The method of claim 13, wherein the preparing the stacked body includes:
  preparing the first transparent member;
  directly forming the intermediate layer on the first transparent member using a physical vapor deposition method; and
  disposing the second transparent member on the intermediate layer,
  wherein the intermediate layer includes a metal material including silver, gold, platinum, copper, aluminum, molybdenum, titanium, an alloy thereof, a metal oxide thereof, a metal nitride thereof.

16. The method of claim 13, wherein the preparing the stacked body includes:
  preparing the first transparent member;
  directly forming the intermediate layer on the first transparent member using a chemical vapor deposition method; and
  disposing the second transparent member on the intermediate layer,
  wherein the intermediate layer includes an inorganic material including silicon oxide, silicon nitride, and silicon oxynitride.

17. A display device comprising a multi-stack joined body including a first transparent member, a second transparent member disposed on the first transparent member, and an intermediate layer interposed between the first transparent member and the second transparent member,
  wherein:
  a joining region in which a physical boundary is not provided between the first transparent member and the intermediate layer and between the second transparent member and the intermediate layer is provided across the first transparent member, the intermediate layer, and the second transparent member without being interrupted in a middle of the joining region.

18. The display device of claim 17, wherein the display device is an organic light emitting display device, and
the organic light emitting display device includes:
the first transparent member;
an organic light emitting element disposed on the first transparent member;
the second transparent member disposed on the organic light emitting element; and
the intermediate layer interposed between the first transparent member and the second transparent member and disposed to at least partially surround the organic light emitting element.

19. The display device of claim 17, wherein the display device is a liquid crystal display device,
the liquid crystal display device includes:
a backlight unit; and
a liquid crystal display panel disposed on the backlight unit,
the backlight unit includes:
a light source which emits light in a blue wavelength band;
a light guide plate which receives light from the light source, guides the light, and then projects the light toward the liquid crystal display panel; and
a wavelength converter which is disposed on an optical path from the light source to the light guide plate and converts a wavelength of incident light and projects the light, and
the wavelength converter includes:
a wavelength converting material;
the first transparent member which defines a space in which the wavelength converting material is accommodated;
the second transparent member disposed on the first transparent member to seal the wavelength converting material; and
the intermediate layer interposed between the first transparent member and the second transparent member and partially joined to the first transparent member and the second transparent member to be unitary therewith.

20. The display device of claim 17, wherein the display device is a liquid crystal display device,
the liquid crystal display device includes:
a backlight unit; and
a liquid crystal display panel disposed on the backlight unit,
the backlight unit includes:
a light source which emits light in a blue wavelength band;
the first transparent member which receives light from the light source, guides the light, and then projects the light toward the liquid crystal display panel; and
a wavelength converter which is disposed on an optical path from the light source to the first transparent member and converts a wavelength of incident light and projects the light, and
the wavelength converter includes:
a wavelength converting material;
the second transparent member which defines a space in which the wavelength converting material is accommodated; and
the intermediate layer interposed between the first transparent member and the second transparent member and partially joined to the first transparent member and the second transparent member to be unitary therewith.

* * * * *